United States Patent [19]

Teraguchi

[11] Patent Number: 5,751,021
[45] Date of Patent: May 12, 1998

[54] SEMICONDUCTOR LIGHT-EMITTING DEVICE

[76] Inventor: Nobuaki Teraguchi, 277-1, Mitsuyoshi, Koryo-cho, Kitakatsuragi-gun, Nara-ken, Japan

[21] Appl. No.: 635,637

[22] Filed: Apr. 22, 1996

[30] Foreign Application Priority Data

Apr. 24, 1995 [JP] Japan .................... 7-098824

[51] Int. Cl.⁶ .................... H01L 33/00; H01S 3/19
[52] U.S. Cl. .................... 257/103; 257/102; 257/96; 257/97; 372/50; 372/45
[58] Field of Search .................... 257/96, 97, 102, 257/103; 372/45, 50

[56] References Cited

U.S. PATENT DOCUMENTS

| | | | |
|---|---|---|---|
| 4,821,274 | 4/1989 | Naud et al. | 257/102 |
| 5,173,751 | 12/1992 | Ota et al. | 257/103 |
| 5,432,808 | 7/1995 | Hatano et al. | 372/45 |
| 5,583,879 | 12/1996 | Yamazaki et al. | 372/45 |
| 5,604,763 | 2/1997 | Kato et al. | 372/45 |

FOREIGN PATENT DOCUMENTS

6-177423  6/1994  Japan.

*Primary Examiner*—Jerome Jackson

[57] ABSTRACT

A semiconductor light-emitting device of the present invention includes a nitride type alloy semiconductor layer. The nitride type alloy semiconductor layer is made of $Al_aGa_bIn_{1-a-b}N$ ($0 \leq a \leq 1$, $0 \leq b \leq 1$, $a+b \leq 1$) including at least one selected from the group consisting of Sc, Ti, V, Cr, Y, La, Ce, Pr, Nd, Sm, Eu, Gd, Tb, Dy, Ho, Er, Tm, Yb and Lu.

5 Claims, 6 Drawing Sheets

(Example 1)

*FIG.11A*

(Example 2)

*FIG.11B*

(Example 3)

SEMICONDUCTOR LIGHT-EMITTING DEVICE

BACKGROUND OF THE INVENTION

1. Field of the Invention

The present invention relates to a semiconductor light-emitting device made of a nitride type alloy semiconductor. More specifically, the present invention relates to a semiconductor light-emitting device capable of emitting light by band-to-band radiative recombination in a wavelength region of ultraviolet to blue or green with reduction of growth temperature difference.

2. Description of the Related Art

In the past, AlN, GaN, and InN have been studied as nitride type III-V-group alloy semiconductors for semiconductor light-emitting devices. Of ternary alloy semiconductors and quarternary alloy semiconductors, AlGaN and GaInN have been studied. In particular, Japanese Laid-Open Patent Publication No. 6-177423 discloses a light-emitting diode (LED) including the combination of an AlGaN barrier layer and a GaInN active layer as a device capable of emitting blue or green light.

However, in the case of fabricating the above-mentioned LEDs, the difference in growth temperature between AlGaN and GaInN causes problems. For example, when using metal organic chemical vapor deposition (MOCVD), the typical growth temperature of AlGaN is about 1000° C., while that of GaInN is about 800° C. Thus, the difference in growth temperatures therebetween is about 200° C. When using molecular beam epitaxy (MBE), the difference in growth temperature is about 100° C. or more. Conventionally, LEDs are produced as follows: an AlGaN barrier layer is grown at a high temperature, and a GaInN active layer is grown while the substrate temperature is lowered. Then, the substrate temperature is raised, and another AlGaN barrier layer is grown. In this process, problems arise in that the crystallinity of the GaInN active layer is degraded due to the increase in temperature after the growth of the GaInN active layer, and the flatness (steepness) of an interface is degraded.

In the conventional semiconductor light-emitting devices made of III-V-group alloy semiconductors, blue or green light emission is realized by carrier recombination via impurity (trap) levels in GaInN. However, light emission by band-to-band radiative recombination is dominant in LEDs in a high carrier injection state, which makes it impossible to realize laser oscillation in light emission by recombination via impurity levels. Thus, in order to realize laser oscillation, it is required to realize blue or green light emission by band-to-band radiative recombination. However, when the GaInN active layer is used, it is difficult to obtain satisfactory crystallinity in a region having an indium (In) mole fraction of 0.2 or more. This makes it difficult to realize blue or green light emission by band-to-band radiative recombination.

SUMMARY OF THE INVENTION

In one embodiment, the semiconductor light-emitting device of this invention includes a nitride type alloy semiconductor layer, wherein the nitride type alloy semiconductor layer is made of $Al_aGa_bIn_{1-a-b}N$ ($0 \leq a \leq 1$, $0 \leq b \leq 1$, $a+b \leq 1$) including at least one selected from the group consisting of Sc, Ti, V, Cr, Y, La, Ce, Pr, Nd, Sm, Eu, Gd, Tb, Dy, Ho, Er, Tm, Yb and Lu.

Alternatively, the semiconductor light-emitting device of this invention includes a barrier layer and an active layer made of a nitride type alloy semiconductor, wherein the barrier layer is made of AlGaInN, and the active layer is made of $Al_aGa_bIn_{1-a-b}N$ ($0 \leq a \leq 1$, $0 \leq b \leq 1$, $a+b \leq 1$) including at least one selected from the group consisting of Sc, Ti, V, Cr, Y, La, Ce, Pr, Nd, Sm, Eu, Gd, Tb, Dy, Ho, Er, Tm, Yb, and Lu.

Alternatively, the semiconductor light-emitting device of this invention includes a barrier layer and an active layer made of a nitride type alloy semiconductor, wherein the barrier layer is made of $Al_aGa_bIn_{1-a-b}N$ ($0 \leq a \leq 1$, $0 \leq b \leq 1$, $a+b \leq 1$) including at least one selected from the group consisting of Sc, Ti, V, Cr, Y, La, Ce, Pr, Nd, Sm, Eu, Gd, Tb, Dy, Ho, Er, Tm, Yb, and Lu, and the active layer is made of $Al_cGa_dIn_{1-c-d}N$ ($0 \leq c \leq 1$, $0 \leq d \leq 1$, $c+d \leq 1$).

According to the present invention, a nitride type compound semiconductor layer is made of $Al_aGa_bIn_{1-a-b}N$ ($0 \leq a \leq 1$, $0 \leq b \leq 1$, $a+b \leq 1$) including at least one selected from the group consisting of Sc, Ti, V, Cr, Y, La, Ce, Pr, Nd, Sm, Eu, Gd, Tb, Dy, Ho, Er, Tm, Yb, and Lu.

Thus, the invention described herein makes possible the advantage of providing a semiconductor light-emitting device in which semiconductor layers with satisfactory good crystallinity are formed by reducing the difference in growth temperature of the semiconductor layers and which is capable of emitting light by band-to-band radiative recombination in a wavelength region of blue or green by reducing a bandgap.

These and other advantages of the present invention will become apparent to those skilled in the art upon reading and understanding the following detailed description with reference to the accompanying figures.

DESCRIPTION OF THE PREFERRED EMBODIMENTS

Figure 12:
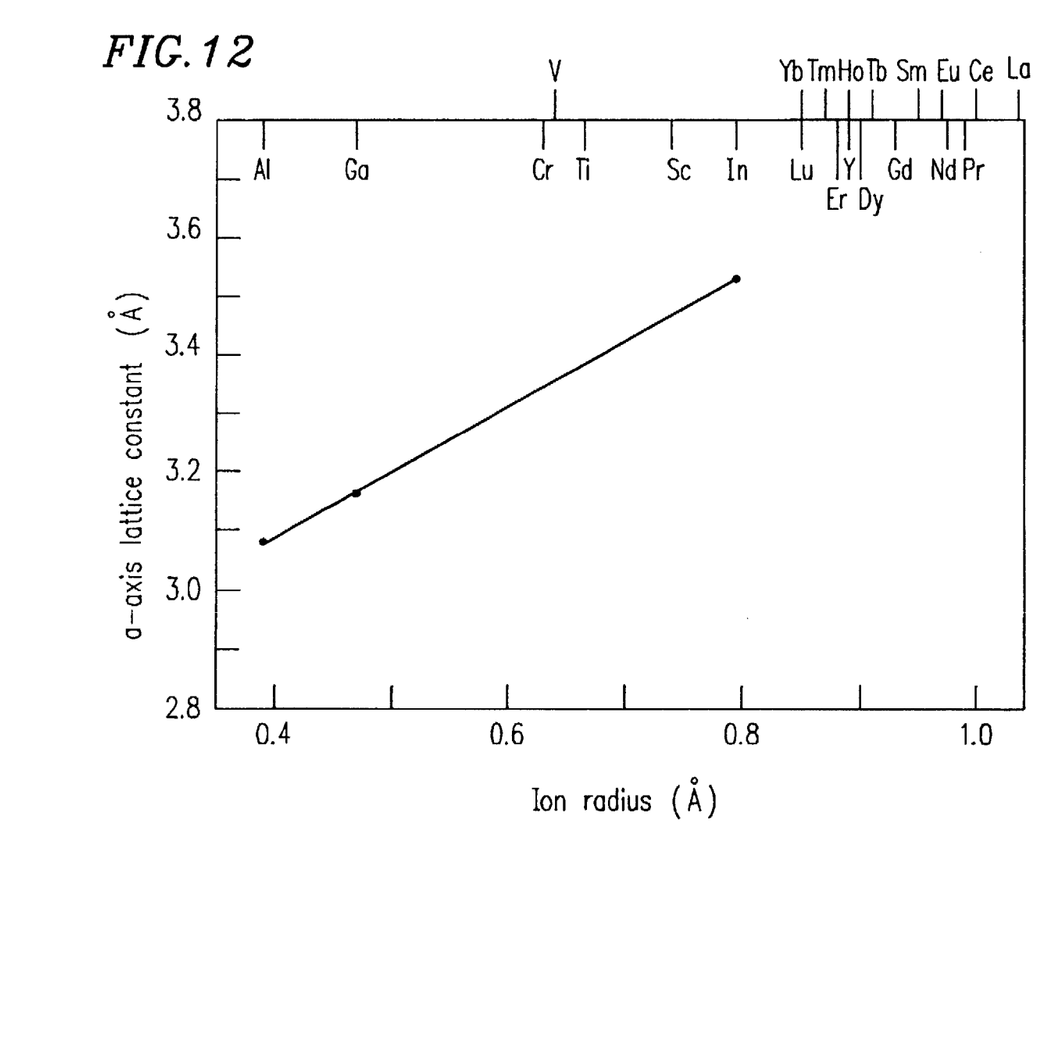
FIG. 12 is a graph showing the relationship between the ion radius and the a-axis lattice constant of nitride semiconductors.

FIG. 12 shows the relationship between the ion radiuses of elements (Al, Ga, and In) forming a nitride type III-V type compound semiconductor and the lattice constant in an a-axis direction of the nitride type III-V type compound semiconductor (AlN, GaN, and InN). As is understood from this figure, the ion radius is in a one-to-one correspondence with the lattice constant. This figure also shows the ion radiuses of trivalent ions of Sc, Ti, V, Cr, Y, La, Ce, Pr, Nd, Sm, Eu, Gd, Tb, Dy, Ho, Er, Tm, Yb, and Lu.

Of these elements, the ion radiuses of Sc, Ti, V, and Cr are larger than those of Al and Ga. Thus, by adding these elements to, for example, AlN of the AlGaInN layer to obtain AlXN (X is made of at least one of Sc, Ti, V, and Cr, and the added amount of X to Al is appropriate), the lattice constant of AlN is made close to or identical with that of GaN, and consequently, bandgap can be decreased. These elements are heavier than Al, so that the growth temperature of these elements is lowered so as to be closer to that of GaN. Alternatively, by adding these elements to GaN to obtain GaXN (X is made of at least one of Sc, Ti, V, and Cr, and the added amount of X to Ga is appropriate), the lattice constant can be made closer to that of InN or the bandgap can be decreased.

Similarly, the ion radiuses of Y, La, Ce, Pr, Nd, Sm, Eu, Gd, Tb, Dy, Ho, Er, Tm, Yb, and Lu are larger than that of In, and these elements are heavier than Al and Ga. Thus, by adding these elements to, for example, AlN and GaN of the AlGaInN layer, the growth temperature of AlN and GaN can be lowered so as to be equal to or lower than that of a layer containing indium (In), the bandgap can be decreased, and the lattice constant can be increased.

Hereinafter, the present invention will be described by way of illustrative examples with reference to the drawings.

EXAMPLE 1

In the present example, a semiconductor light-emitting device emitting green light comprises barrier layers made of $Ga_{0.9}In_{0.1}N$ and an active layer made of $Ga_{0.93}Gd_{0.07}N$.

Figure 1:
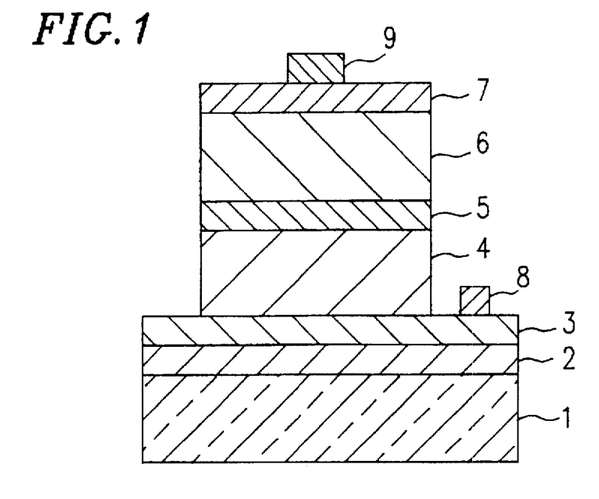
FIG. 1 is a cross-sectional view showing a structure of a semiconductor light-emitting device of Example 1 according to the present invention.

FIG. 1 is a cross-sectional view showing a structure of a semiconductor light-emitting device of Example 1. The semiconductor light-emitting device includes a low temperature growth GaN buffer layer 2, an n-type GaN contact layer 3, an n-type $Ga_{0.9}In_{0.1}N$ barrier layer 4, an i-type $Ga_{0.93}Gd_{0.07}N$ active layer 5, a p-type $Ga_{0.9}In_{0.1}N$ barrier layer 6, and a p-type GaN contact layer 7 formed in this order on a sapphire substrate 1. The n-type barrier layer 4, the i-type $Ga_{0.93}Gd_{0.07}N$ active layer 5, the p-type $Ga_{0.9}In_{0.1}N$ barrier layer 6, and the p-type GaN contact layer 7 are partially removed so that a portion of the n-type contact layer 3 is exposed. An n-type electrode 8 is formed on the exposed portion of the n-type contact layer 3 and a p-type electrode 9 is formed on the p-type contact layer 7. The low temperature growth GaN buffer layer 2 has a thickness of 300 Å; the n-type GaN contact layer 3 has a thickness of 0.1 µm and a carrier concentration of $1 \times 10^{18}$ cm$^{-3}$; the n-type $Ga_{0.9}In_{0.1}N$ barrier layer 4 has a thickness of 3.0 µm and a carrier concentration of $5 \times 10^{17}$ cm$^{-3}$; the i-type $Ga_{0.93}Gd_{0.07}N$ active layer 5 has a thickness of 500 Å; the p-type $Ga_{0.9}In_{0.1}N$ barrier layer 6 has a thickness of 0.5 µm and a carrier concentration of $5 \times 10^{17}$ cm$^{-3}$; and the p-type GaN contact layer 7 has a thickness of 0.2 µm and a carrier concentration of $2 \times 10^{18}$ cm$^{-3}$.

In the present example, the active layer 5 and the barrier layers 4 and 6 are grown by MBE at 600° C. The active layer 5 is doped with Gd, so that its growth temperature can be set as low as the barrier layers 4 and 6. Therefore, no decrease in crystallinity and flatness of an interface are observed. Furthermore, the lattice constant of the active layer 5 is almost equal to those of the barrier layers 4 and 6 so as to obtain lattice matching. In this manner, satisfactory crystallinity is obtained.

Figure 2:
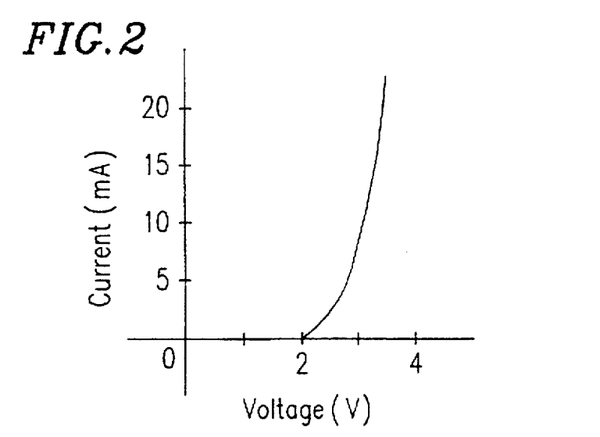
FIG. 2 is a graph showing a current-voltage characteristic of the semiconductor light-emitting device of Example 1 according to the present invention.
Figure 3:
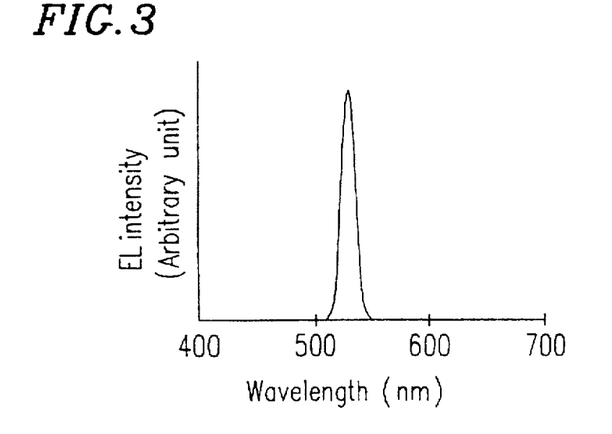
FIG. 3 is a graph showing an electroluminescence (EL) spectrum of the semiconductor light-emitting device of Example 1 according to the present invention.

FIG. 2 shows a current-voltage characteristic of the semiconductor light-emitting device of the present example. The current-voltage characteristic of the semiconductor light-emitting device is almost equal to that of the conventional semiconductor light-emitting device using an AlGaN barrier layer/GaInN active layer. FIG. 3 shows an EL spectrum. In the conventional semiconductor light-emitting device using the AlGaN barrier layer/GaInN active layer, a full width at half maximum (FWHM) of light emission is large (i.e., 80 nm) because light is emitted by recombination via impurity levels. In contrast, in the semiconductor light-emitting device of the present example, crystallinity is satisfactory and light can be emitted by band-to-band radiative recombination, so that a full width at half maximum (FWHM) of light emission is remarkably reduced (i.e., 16 nm). Furthermore, the bandgap can be reduced by doping the active layer 5 with Gd, so that the light-emission wavelength can be enlarged and the color of light thus obtained can be made close to purer green, compared with the conventional semiconductor light-emitting device including the AlGaN barrier layer/GaInN active layer.

EXAMPLE 2

In the present example, a semiconductor light-emitting device emitting blue light is produced by using barrier layers made of GaN and an active layer made of $Al_{0.88}La_{0.12}N$.

Figure 4:
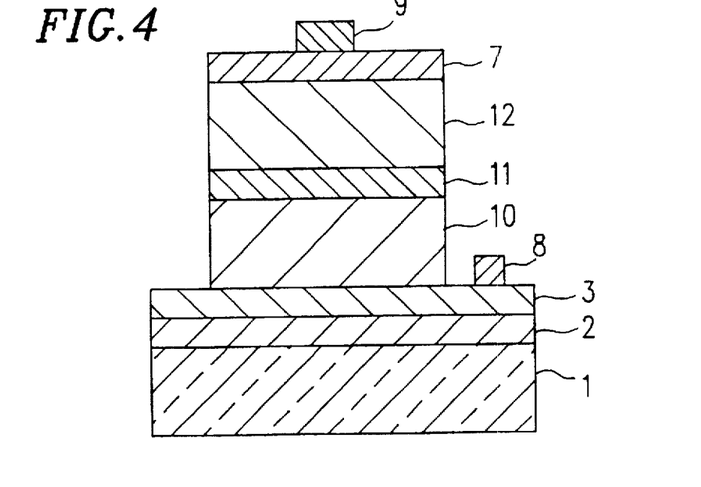
FIG. 4 is a cross-sectional view showing a structure of a semiconductor light-emitting device of Example 2 according to the present invention.

FIG. 4 is a cross-sectional view showing a structure of a semiconductor light-emitting device of Example 2. The semiconductor light-emitting device includes a low temperature growth GaN buffer layer 2, an n-type GaN contact layer 3, an n-type GaN barrier layer 10, an i-type $Al_{0.88}La_{0.12}N$ active layer 11, a p-type GaN barrier layer 12, and a p-type GaN contact layer 7 in this order on a sapphire substrate 1. The n-type GaN barrier layer 10, the i-type $Al_{0.88}La_{0.12}N$ active layer 11, the p-type GaN barrier layer 12, and the p-type GaN contact layer 7 are partially removed so that a portion of the n-type contact layer 3 is exposed. An n-type electrode 8 is formed on the exposed portion of the n-type contact layer 3 and a p-type electrode 9 is formed on the p-type contact layer 7. The low temperature growth GaN buffer layer 2 has a thickness of 300 Å; the n-type GaN contact layer 3 has a thickness of 0.1 µm and a carrier concentration of $1 \times 10^{18}$ cm$^{-3}$; the n-type GaN barrier layer 10 has a thickness of 3.0 µm and a carrier concentration of $5 \times 10^{17}$ cm$^{-3}$; the i-type $Al_{0.88}La_{0.12}N$ active layer 11 has a thickness of 500 Å; the p-type GaN barrier layer 12 has a thickness of 0.5 µm and a carrier concentration of $5 \times 10^{17}$ cm$^{-3}$; and the p-type GaN contact layer 7 has a thickness of 0.2 µm and a carrier concentration of $2 \times 10^{18}$ cm$^{-3}$.

In the present example, the active layer 11 and the barrier layers 10 and 12 are grown by MOCVD at 1000° C. For the source of Al and Ga elements, trimethylaluminum (TMA) and trimethylgallium (TMG) are used, and for the source of La, a DPM((CH$_3$)$_3$.C.CO.CH$_2$CO.C(CH$_3$)$_3$) type β-diketone complex is used. The active layer 11 is doped with La, so that its growth temperature can be set as low as the barrier layers 10 and 12. Therefore, no decrease in crystallinity and flatness of an interface are found. Furthermore, the lattice constant of the active layer 11 is almost equal to those of the barrier layers 10 and 12 so as to obtain lattice matching. In this manner, satisfactory crystallinity is obtained.

Figure 5:
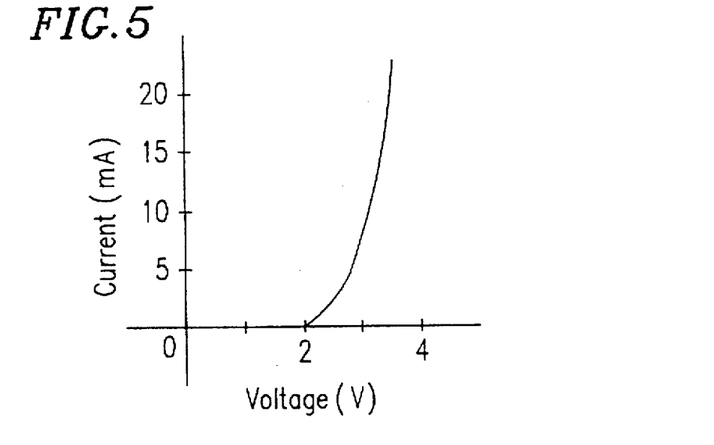
FIG. 5 is a graph showing a current-voltage characteristic of the semiconductor light-emitting device of Example 2 according to the present invention.
Figure 6:
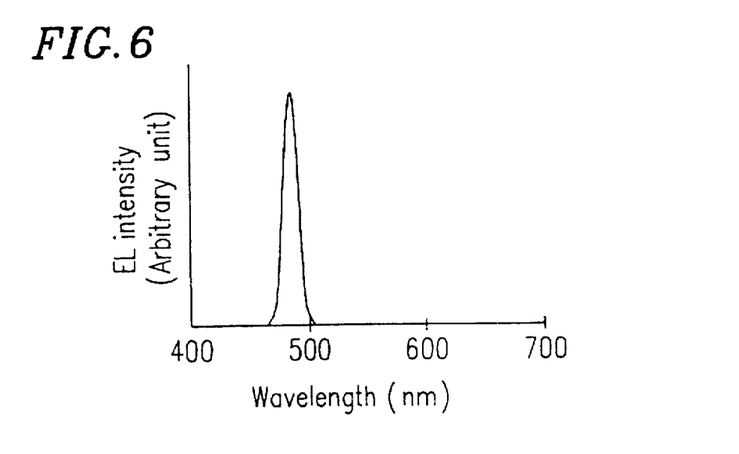
FIG. 6 is a graph showing an EL spectrum of the semiconductor light-emitting device of Example 2 according to the present invention.

FIG. 5 shows a current-voltage characteristic of the semiconductor light-emitting device of the present example. The current-voltage characteristic of the semiconductor light-emitting device is almost equal to that of the conventional semiconductor light-emitting device using an AlGaN barrier layer/GaInN active layer. FIG. 6 shows an EL spectrum. In the conventional semiconductor light-emitting device using the AlGaN barrier layer/GaInN active layer, FWHM of light emission is large (i.e., 80 nm) because light is emitted by recombination via impurity levels. In contrast, in the semiconductor light-emitting device of the present example, crystallinity is satisfactory and light can be emitted by band-to-band radiative recombination in the same way as in Example 1, so that FWHM of light emission is remarkably reduced (i.e., 15 nm). Furthermore, the bandgap can be reduced by doping the active layer 11 with La, so that the light-emission wavelength can be enlarged and the color of light thus obtained can be made close to purer blue, compared with the conventional semiconductor light-emitting device including the AlGaN barrier layer/GaInN active layer.

EXAMPLE 3

In the present example, a semiconductor light-emitting device emitting ultraviolet light is produced by using an active layer made of GaN and barrier layers made of Al$_{0.9}$Cr$_{0.1}$N.

Figure 7:
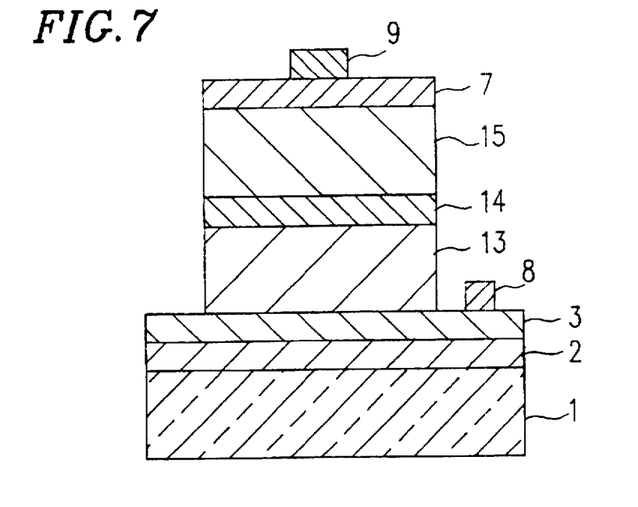
FIG. 7 is a cross-sectional view showing a structure of a semiconductor light-emitting device of Example 3 according to the present invention.

FIG. 7 is a cross-sectional view showing a structure of a semiconductor light-emitting device of Example 3. The semiconductor light-emitting device includes a low temperature growth GaN buffer layer 2, an n-type GaN contact layer 3, an n-type Al$_{0.9}$Cr$_{0.1}$N barrier layer 13, an i-type GaN active layer 14, a p-type Al$_{0.9}$Cr$_{0.1}$N barrier layer 15, and a p-type GaN contact layer 7 in this order on a sapphire substrate 1. The n-type Al$_{0.9}$Cr$_{0.1}$N barrier layer 13, the i-type GaN active layer 14, the p-type Al$_{0.9}$Cr$_{0.1}$N barrier layer 15, and the p-type GaN contact layer 7 are partially removed so that a portion of the n-type GaN contact layer 3 is exposed. An n-type electrode 8 is formed on the exposed portion of the n-type GaN contact layer 3 and a p-type electrode 9 is formed on the p-type GaN contact layer 7. The low temperature growth GaN buffer layer 2 has a thickness of 300 Å; the n-type GaN contact layer 3 has a thickness of 0.1 μm and a carrier concentration of 1×10$^{18}$ cm$^{-3}$; the n-type Al$_{0.9}$Cr$_{0.1}$N barrier layer 13 has a thickness of 3.0 μm and a carrier concentration of 5×10$^{17}$ cm$^{-3}$; the i-type GaN active layer 14 has a thickness of 500 Å; the p-type Al$_{0.9}$Cr$_{0.1}$N barrier layer 15 has a thickness of 0.5 μm and a carrier concentration of 5×10$^{17}$ cm$^{-3}$; and the p-type GaN contact layer 7 has a thickness of 0.2 μm and a carrier concentration of 2×10$^{18}$ cm$^{-3}$.

In the present example, the active layer 14 and the barrier layers 13 and 15 are grown by MBE at 600° C. The barrier layers 13 and 15 are doped with Cr, so that its growth temperature can be set as low as the active layer 14. Therefore, no decrease in crystallinity and flatness of an interface are observed. Furthermore, the lattice constant of the active layer 14 is almost equal to those of the barrier layers 13 and 15 so as to obtain lattice matching. In this manner, satisfactory crystallinity is obtained.

Figure 8:
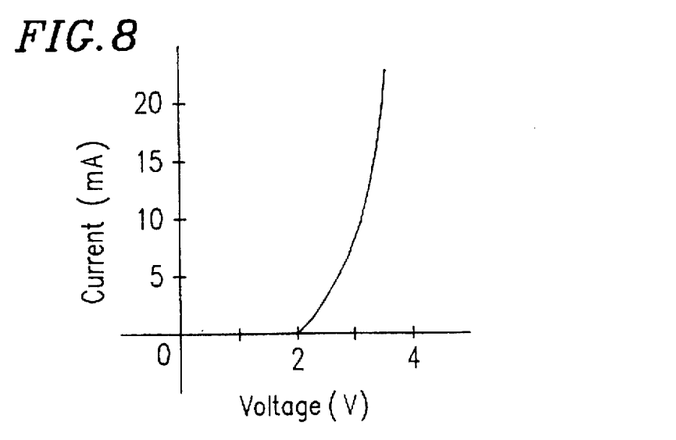
FIG. 8 is a graph showing a current-voltage characteristic of the semiconductor light-emitting device of Example 3 according to the present invention.
Figure 9:
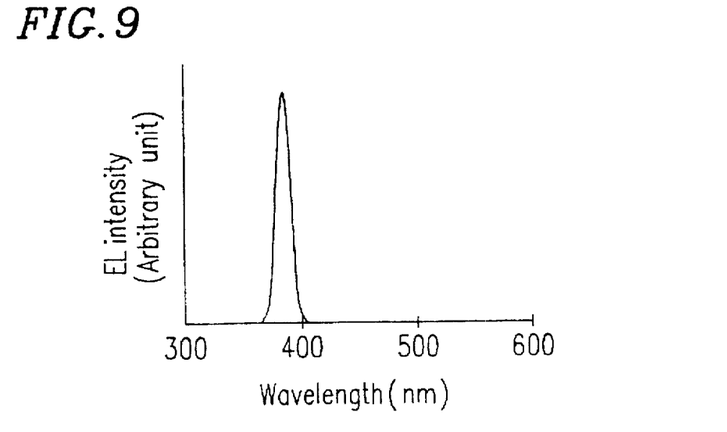
FIG. 9 is a graph showing an EL spectrum of the semiconductor light-emitting device of Example 3 according to the present invention.

FIG. 8 shows a current-voltage characteristic of the semiconductor light-emitting device of the present example. The current-voltage characteristic of the semiconductor light-emitting device is almost equal to that of the conventional semiconductor light-emitting device using an AlGaN barrier layer/GaInN active layer. FIG. 9 shows an EL spectrum. In the conventional semiconductor light-emitting device using the AlGaN barrier layer/GaInN active layer, FWHM of light emission is large (i.e., 80 nm) because light is emitted by recombination via impurity levels. In contrast, in the semiconductor light-emitting device of the present example, crystallinity is satisfactory and light can be emitted by band-to-band radiative recombination in the same way as in Example 1, so that FWHM of light emission is remarkably improved (i.e., 15 nm).

EXAMPLE 4

Figure 10:
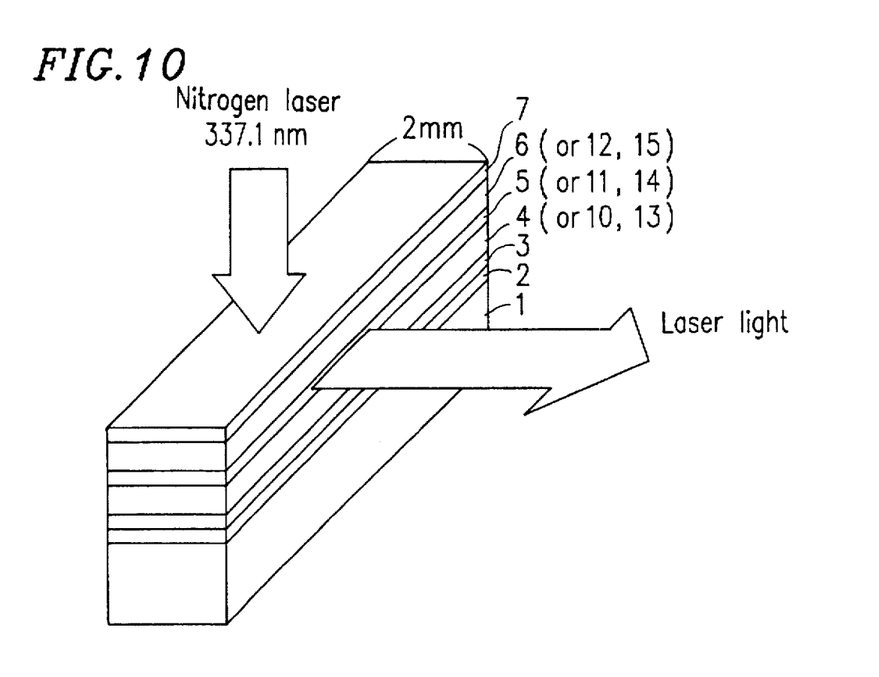
FIG. 10 is a perspective view showing the arrangement of a semiconductor light-emitting device of Example 4 according to the present invention and a nitride laser.

In the present example, optical pumping is conducted with a nitrogen laser (wavelength: 337.1 nm; pulse width: 10 nsec; duty: 10$^{-7}$) as shown in FIG. 10 in a structure described with respect to Examples 1 through 3.

Figure 11A:
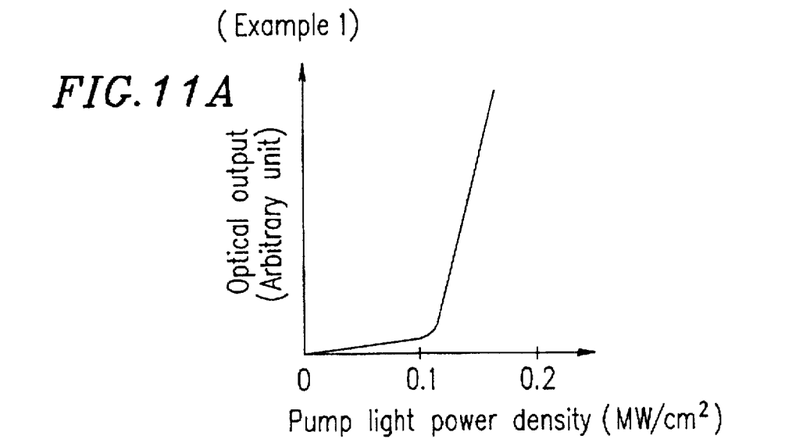
FIGS. 11A through 11C are graphs showing the relationships between the optical power density of pump light and the optical output of the semiconductor light-emitting devices of Examples 1 through 3 according to the present invention, respectively.
Figure 11B:
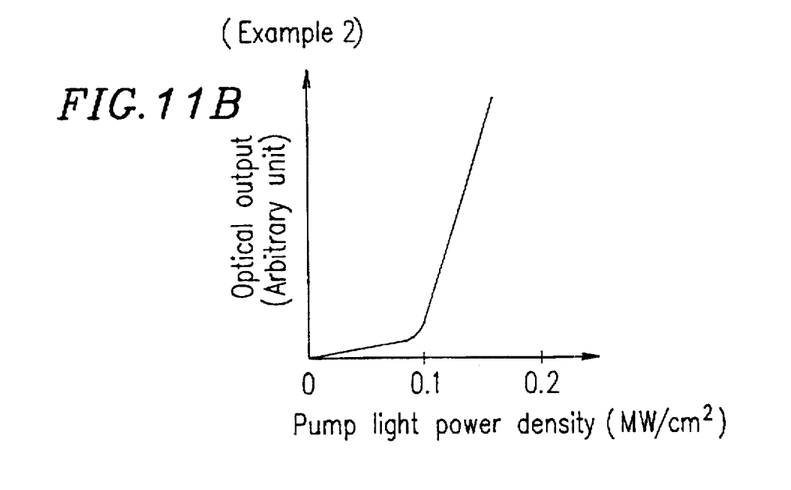
Figure 11C:
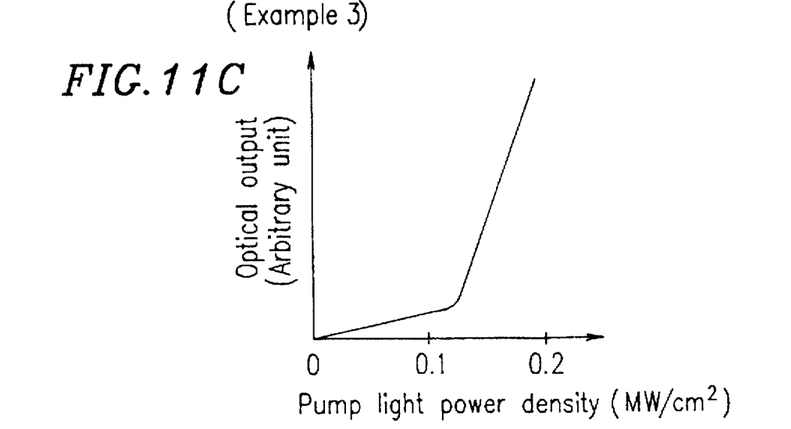

FIGS. 11A through 11C are graphs showing the relationships between the pump light power density and the optical output of the semiconductor light-emitting devices of Examples 1 through 3 according to the present invention, respectively. As is apparent from these figures, laser oscillation can be realized by optical pumping in any of the samples.

In Examples 1 through 4, Gd, La, and Cr are used as an element X to be added to an AlGaInN layer. However, any of Sc, Ti, V, Cr, Y, La, Ce, Pr, Nd, Sm, Eu, Gd, Tb, Dy, Ho, Er, Tm, Yb, and Lu can be used in place of Gd, La, and Cr. Two kinds or more thereof can also be used. Stable crystal structures of nitrides of these elements (i.e., Sc, Ti, V, Cr, Y, La, Ce, Pr, Nd, Sm, Eu, Gd, Tb, Dy, Ho, Er, Tm, Yb, and Lu) are rock-salt structures. In the case where any of these elements is added in a small amount to AlGaInN which is stable in a wurtzite structure, the AlGaInN with any of these elements added has the same crystal structure as that of AlGaInN. This is similar to the case where MgS and MgSe which are stable in a rock-salt structure is added to ZnS and ZnSe which are stable in a zinc-blend structure. Although the added amount (y in the case of (AlGaIn)$_{1-y}$X$_y$N of the element X depends upon the ion radius of the element to be added, it is preferably 20% or less, more preferably 10% or less in terms of stability of the crystal structure.

The mole fractions a and b of an Al$_a$Ga$_b$In$_{1-a-b}$N semiconductor layer are not limited to those shown in the above examples. AlN, GaN, InN, and combinations thereof such as ternary and quarternary semiconductors can be used.

In Examples 1 through 4, LEDs with a double hetero structure are used. In place of these, LEDs with a homojunction structure or a single hetero structure; and semiconductor laser devices with a separate confinement heterostructure (SCH), graded index separate confinement heterostructure (GRIN-SCH), or the like can be used.

The barrier layer or the active layer is doped with the above-mentioned elements. Both layers can be doped. Other AlGaInN layers can be doped. In these cases, effects such as the decrease in growth temperature difference, matching of lattice constants, and the decrease in bandgap can be obtained.

As is apparent from the above description, according to the present invention, the difference in growth temperature of semiconductor layers can be decreased and the decrease in crystallinity and flatness of an interface can be prevented, which have been difficult in the conventional semiconductor light-emitting device using AlGaN/GaInN ternary compounds. Furthermore, the lattice constants of the semiconductor layers can be made closer to each other, so that satisfactory crystallinity can be obtained.

Furthermore, a semiconductor light-emitting device can be obtained, in which light emission wavelength is enlarged by decreasing bandgap, light is emitted by band-to-band radiative recombination in a wavelength region from ultra-violet to blue or green (which has been difficult to achieve in the conventional semiconductor light-emitting device), and laser oscillation is realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light-emitting device comprising a nitride type alloy semiconductor layer, wherein the nitride type alloy semiconductor layer is made of $(AlGaIn)_{1-y}X_yN (0 \leq y \leq 1)$ where X is at least one selected from the group consisting of Sc, Ti, V, Cr, Y, La, Ce, Pr, Nd, Sm, Eu, Gd, Tb, Dy, Ho, Er, Tm, Yb and Lu to have a decreased bandgap as compared to that obtained without the addition of X.

2. A semiconductor light emitting device comprising a barrier layer and an active layer made of a nitride type alloy semiconductor, wherein the barrier layer is made of AlGaInN, and the active layer is made of $(AlGaIn)_{1-y}X_yN(0 \leq y \leq 1)$ where X is at least one selected from the group consisting of Sc, Ti, V, Cr, Y, La, Ce, Pr, Nd, Sm, Eu, Gd, Tb, Dy, Ho, Er, Tm, Yb, and Lu to have a decreased bandgap as compared to that obtained without the addition of X.

3. A semiconductor light-emitting device comprising a barrier layer and an active layer made of a nitride type alloy semiconductor, wherein the barrier layer is made of $Al_aGa_bIn_{1-a-b}N$ ($0 \leq a \leq 1$, $0 \leq b \leq 1$, $a+b \leq 1$) including at least one selected from the group consisting of Sc, Ti, V, Cr, Y, La, Ce, Pr, Nd, Sm, Eu, Gd, Tb, Dy, Ho, Er, Tm, Yb, and Lu, and the active layer is made of $Al_cGa_dIn_{1-c-d}N$ ($0 \leq c \leq 1$, $0 \leq d \leq 1$, $c+d \leq 1$).

4. A semiconductor light-emitting device according to claim 1, wherein the nitride type alloy semiconductor layer is made of $(AlGaIn)_{1-y}X_yN$ ($0 \leq y \leq 0.2$).

5. A semiconductor light-emitting device according to claim 2, wherein the nitride type alloy semiconductor layer is made of $(AlGaIn)_{1-y}X_yN$ ($0 \leq y \leq 0.2$).

* * * * *

UNITED STATES PATENT AND TRADEMARK OFFICE
CERTIFICATE OF CORRECTION

PATENT NO. : 5,751,021
DATED : May 12, 1998
INVENTOR(S) : Nobuaki Teraguchi

It is certified that error appears in the above-identified patent and that said Letters Patent is hereby corrected as shown below:  On the title page, Before "[21] Appl. No.: 635,637", insert --Assignee: THE SHARP KABUSHIKI KAISHA, Osaka, Japan--.

--Assignee: THE SHARP KABUSHIKI KAISHA, Osaka, Japan--

Signed and Sealed this

Twentieth Day of July, 1999

Attest:

Q. TODD DICKINSON

*Attesting Officer*     *Acting Commissioner of Patents and Trademarks*